United States Patent [19]
Hata et al.

[11] Patent Number: 5,908,330
[45] Date of Patent: Jun. 1, 1999

[54] PLATELIKE MEMBER

[75] Inventors: Takao Hata; Hirotaka Makino, both of Yokkaichi, Japan

[73] Assignee: Sumitomo Wiring Systems, Ltd.

[21] Appl. No.: 08/975,567

[22] Filed: Nov. 21, 1997

[51] Int. Cl.[6] .................................................. H01R 13/40
[52] U.S. Cl. ............................................. 439/590; 439/79
[58] Field of Search ................................ 439/79, 80, 590

[56] References Cited

U.S. PATENT DOCUMENTS

| | | | |
|---|---|---|---|
| 4,056,300 | 11/1977 | Schumacher | 439/590 |
| 5,370,540 | 12/1994 | Kobayashi | 439/78 |
| 5,380,222 | 1/1995 | Kobayashi | 439/590 |

FOREIGN PATENT DOCUMENTS

| | | |
|---|---|---|
| 0 723 309 A2 | 7/1996 | European Pat. Off. . |
| 0 780 933 A2 | 6/1997 | European Pat. Off. . |
| 0 803 940 A2 | 10/1997 | European Pat. Off. . |

*Primary Examiner*—Neil Abrams
*Assistant Examiner*—T C Patel
*Attorney, Agent, or Firm*—Anthony J. Casella; Gerald E. Hespos; Ludomir A. Budzyn

[57] ABSTRACT

A platelike member (10) for being associated with an electrical device (70), includes openings or recesses (30) for receiving terminals (50) therein, the openings or recesses (30) being arranged in columns and rows. The openings or recesses (30) in one column and/or row are at least partly offset with respect to ones in adjacent columns and/or rows, and at least some of the columns and rows are intersected by at least one means (20) for reducing or absorbing stress and/or strain. Thus, the platelike member (10) can absorb and/or reduce thermal and/or mechanical stress and/or strain induced during the assembling and mounting operation while allowing a high density arrangement of the terminals (50).

7 Claims, 5 Drawing Sheets

PLATELIKE MEMBER

BACKGROUND OF THE INVENTION

1. Field of the Invention

The present invention relates to a platelike member for being associated with an electrical device, such as an alignment plate for a connector, a circuit board, and the like, which comprises openings or recesses for receiving terminals therein.

2. Description of the Prior Art

In general, platelike members for being associated with an electrical device have openings or recesses designed for receiving terminals therein substantially without any play so that the respective terminals can be properly guided, held or even soldered. Conventionally, the openings or recesses for receiving the terminals therein are arranged in columns and rows. Usually, the respective terminals are inserted and fixed either by simple engagement or with the help of solder or other convenient means. However, mechanical or thermal stress or strain during use may alter the holding or positioning function of the platelike member, thus resulting in a misalignment, a faulty contact or even breakage of solder.

Accordingly, it is an object of the present invention to provide a platelike member for being associated with an electrical device, comprising a large number of openings or recesses for receiving terminals therein. The platelike member is provided to withstand or to balance imparted stress or strain.

SUMMARY OF THE INVENTION

The invention is directed to a platelike member intended for an electrical device, namely a part of an alignment board, a circuit board, or the like, comprising openings or recesses for receiving terminals therein. Generally, the openings or recesses are arranged in columns and rows. However, according to the present invention, to provide a higher density arrangement of terminals, the openings or recesses in one column and/or row are at least partly offset with respect to ones in adjacent columns and/or rows. Further, at least some of the columns and rows are intersected by at least one means for reducing or absorbing stress and/or strain. It should be noted most or even substantially all of the columns and/or rows may be intersected by the at least one means. The inventive platelike member could, for instance, be a circuit board for mounting, for instance, a chip thereon. When a chip is to be soldered with the circuit board, a high density arrangement of through holes is necessary for accommodating the respective terminals or leads of the chip. Further, once the chip or other electrical device is soldered with the circuit board, thermal changes in the different components are likely to result in high stresses and strain, leading quite often to solder breakage or even erroneous contacts. With the inventive structure, it is possible to combine a high density arrangement of openings and recesses for receiving terminals with the feature of providing a highly efficient protection against stress and/or strain and thus against solder breakage.

Preferably, the offset of openings or recesses in one column and/or row with respect to ones in adjacent columns and/or rows corresponds substantially to half the spacing between adjacent recesses or openings in one row or column. With this preferred feature can be formed a very simple high density pattern of openings or recesses, which is very regular and can easily receive a large number of terminals.

Preferably, said means for reducing and/or absorbing stress and/or strain (for convenience's sake hereinafter only called "means"), comprises a thinned or weakened portion of the platelike member, a punched portion and/or a slit or void portion. In any case, the means should be formed such that the occurring stress or strain can be reduced or absorbed, while the structural integrity of the platelike member is changed only slightly.

According to a preferred embodiment, said means is elongated and takes a curved and/or tilted path with respect to the columns and/or rows over at least a part of the extension. Preferably, said means extend substantially from one side to another side of the platelike member or even back to the same side. This means may take an interrupted configuration. For example, the elongated means may divide into two or more portions. Of course, the various sections or portions of the means could be combined with each other, such that the elongated means take a complex form such as a zigzag, S-shape, semicircular or other form in order to suitably reduce and/or absorb stress and/or strain induced in different patterns.

A preferred platelike member further comprises one or more mounting portions, serving for the association with an electrical device or also for the mounting of the platelike member on a housing or another member, for instance by snap engagement, screw means or the like, wherein one or more notches are formed in such a way as to correspond to the mounting portions in order to reduce and/or absorb mechanical stress and/or strain generated during the mounting. By providing the platelike member with this feature, a remaining risk of deformation and solder breakage can be eliminated which occurs in particular during the mounting and/or fixing of the platelike member with an electrical device or with an other member such as a housing.

Preferably, said means, in particular elongated means, follows at least partly a path corresponding to a substantially concentric circle with respect to the corresponding notch and/or mounting portion. It should be noted that preferably more than one substantially concentric circle is provided. By providing the means for reducing and/or absorbing stress and/or strain in substantially the form of a concentric circle or a concentric semicircle with respect to notches and/or mounting portions, the thermal and mechanical stress or strain can be more uniformly distributed. Thus, a platelike member such as an alignment plate or a circuit board is able to reduce or absorb thermal as well as mechanical stress and/or strain by a large amount.

Preferably, said means is provided between each pair of adjacent openings or recesses in one row and/or column. However, it is also possible to provide said means only between every second pair of adjacent openings or recesses or in another way. In a preferred embodiment, said means is provided substantially midway between adjacent recesses or openings of one row and/or column.

In the inventive platelike member, said means preferably form narrow, movable holding portions which are obliquely juxtaposed and comprise the recesses or openings of different rows and/or columns. By forming such narrow, movable holding portions, individual recesses or openings of respective rows and/or columns can be grouped or gathered, such that a common movement of these can take place, wherein each recess or opening of one row and/or column is moved independently of the other recesses or openings of said row and/or column.

Preferably, said means comprises broadened, larger or wider portions in order to increase the ability of reducing or absorbing stress and/or strain. Accordingly, said obliquely juxtaposed narrow, movable holding portions may comprise broad and narrow portions, such that the holding portions can be selectively moved to more effectively respond to a distribution pattern of the occurring stress and/or strain. In general, the provision of broadened portions allows a selective design of said means in conformity with the expected occurrence of highest thermal and/or mechanical stress and/or strain.

According to a preferred embodiment, said platelike member is an alignment plate for being associated to a connector housing, which is to be mounted on a circuit board and/or to be connected with another connector housing.

The invention also relates to a connector, in particular to one for a circuit board, comprising a connector housing to be mounted on a circuit board and/or to be connected to another connector housing, a plurality of terminals which project from the connector housing and an alignment plate formed with a plurality of positioning holes through which the respective terminals are inserted or insertable, wherein the alignment plate is a platelike member as recited above, which allows elastic deformation, and in particular elastic displacement of the openings or recesses, which then act as positioning holes.

In summary, the inventive platelike member and connector are intended for permitting an elastic displacement of openings or recesses, preferably within the plane of the platelike member in order to reduce, absorb or prevent any increase in stress and/or strain, in particular in soldered or other joints undergoing thermal and/or mechanical changes.

Further features and advantages of the present invention will become apparent upon reading the following non-limiting description of one exemplary embodiment, taking reference to the accompanying drawings.

DETAILED DESCRIPTION OF THE PREFERRED EMBODIMENTS

Figure 1:
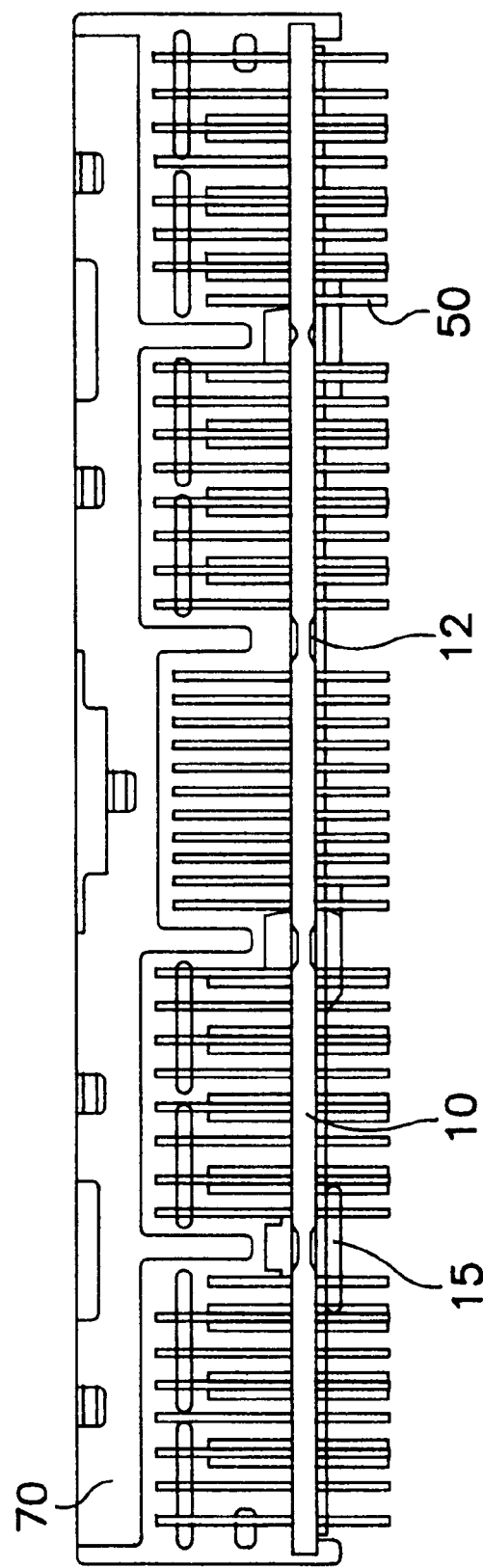
FIG. 1 is a rear elevational view of a connector having an associated platelike member according to one embodiment of the present invention.

With reference to FIG. 1, a connector housing 70 is shown with an associated plate-like member 10, which, in the illustrated embodiment, is an alignment plate. The connector housing 70 comprises a multitude of terminals 50. The terminals 50 extend from the interior of the connector housing 70 and then are bent downwardly to be passed through the alignment plate 10 and connected with, for instance, a circuit board. To align the respective terminals 50, the connector housing 70 has the associated alignment plate 10 which includes openings or recesses for receiving the respective terminals 50 therein. The connector housing 70 of the illustrated embodiment is provided with mounting portions 15. Each mounting portion 15 has a mount hole 15a for mounting an assembly of the connector housing 70 and the alignment plate 10 on a circuit board by means of, for instance, screws or other fixing means. In this embodiment, three mounting portions 15 project from the bottom surface and are at specified intervals. As can be seen from the illustration of FIG. 1, the alignment plate 10 is provided with notches or thinned portions 12 in positions corresponding to the mounting portions 15 to allow some bending or flexing. Thus mechanical stress and/or strain can be reduced and/or absorbed during the mounting of the connector housing 70 and the alignment plate 10.

Figure 2:
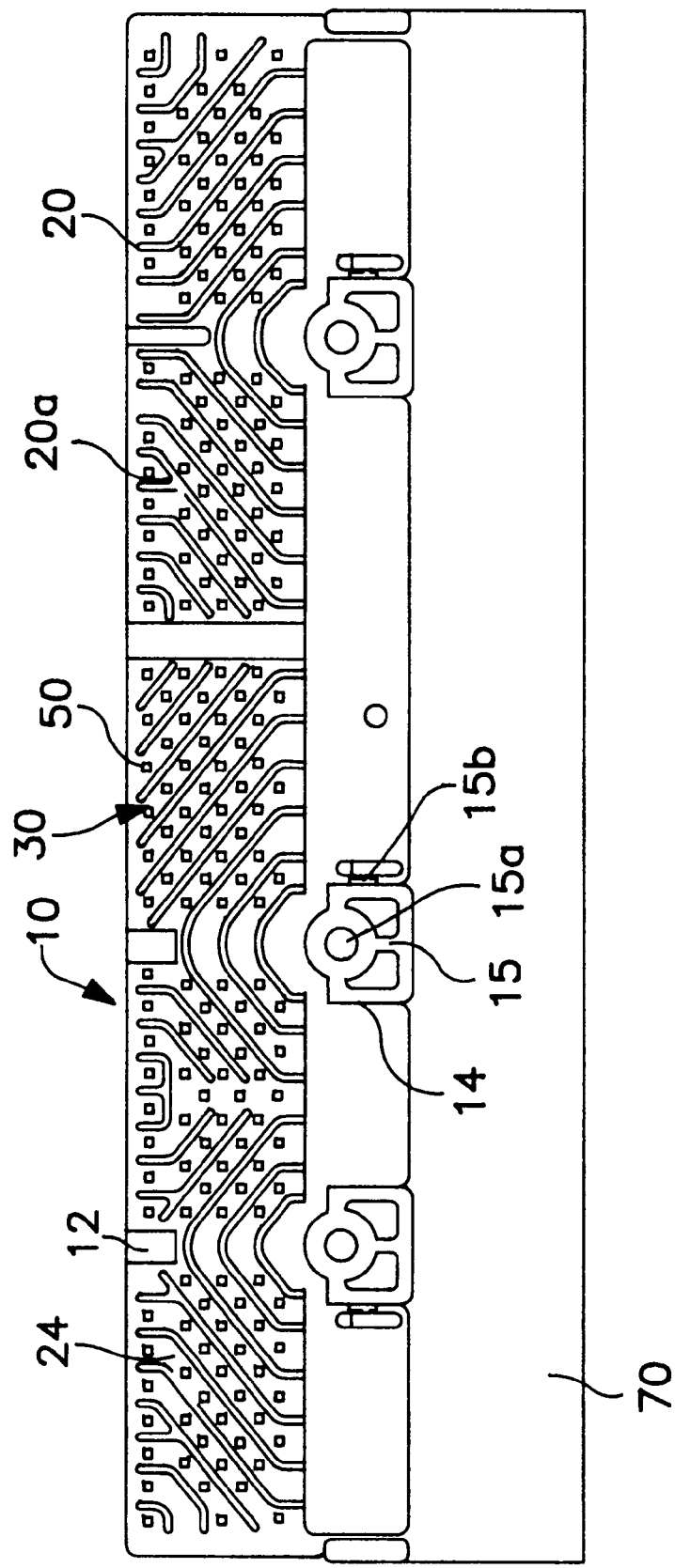
FIG. 2 is a bottom view of the connector and the associated platelike member as an alignment plate as shown in FIG. 1.

With reference to FIG. 2, showing the connector housing 70 and the alignment plate 10 in a bottom view, mounting recesses 14 are so formed in the alignment plate 10 as to correspond substantially to the mounting portions 15 of the connector housing 70. The alignment plate 10 is mounted on the connector housing 70 by engaging the mounting recesses 14 with claw portions 15b, each of which projects from one side of the mounting portion 15. As can be seen from FIG. 5, with the connector housing 70 mounted on the circuit board, the mounting portions 15 are closely secured to the circuit board, whereas the alignment plate 10 is slightly vertically spaced from the circuit board. Further, as can be seen clearly in this view, the alignment plate 10 comprises a plurality of openings or recesses (here through holes) 30 each of which accommodates one of the terminals 50 that emerges from the connector housing and is bent downwardly to pass through the alignment plate 10. As can be seen from FIG. 2, the openings 30 and thus the terminals 50 are arranged in rows and columns. The openings 30 in one row or column are offset from those of adjacent row or column by half the distance or spacing separating respective openings 30. This inventive feature allows a higher density arrangement of the terminals 50. With the illustrated pattern, a higher number of terminals 50 can be integrated within a specific area than in the case where parallel rows and columns are provided without any offset. A further important feature of the invention is that punched portions 20 are so formed that each intersects at least one column and row. For instance, the uppermost punched portion 20 at the right side of the alignment plate 10 intersects the uppermost row as well as the column located on the right side of the alignment plate 10 in this special view. The illustrated embodiment also shows recesses 12 in front of the three respective mounting recesses 14. Further, each punched portion 20 is elongated and takes a curved and tilted path, in particular forming a substantially concentric circle with respect to the mounting recess 14. Further, some of the punched portions 20 are forked as seen in portions 20a, i.e. one elongated portion of the punched portion 20 divides into two or more sections, which could extend for instance on opposite sides of one of the openings 30.

Figure 3:
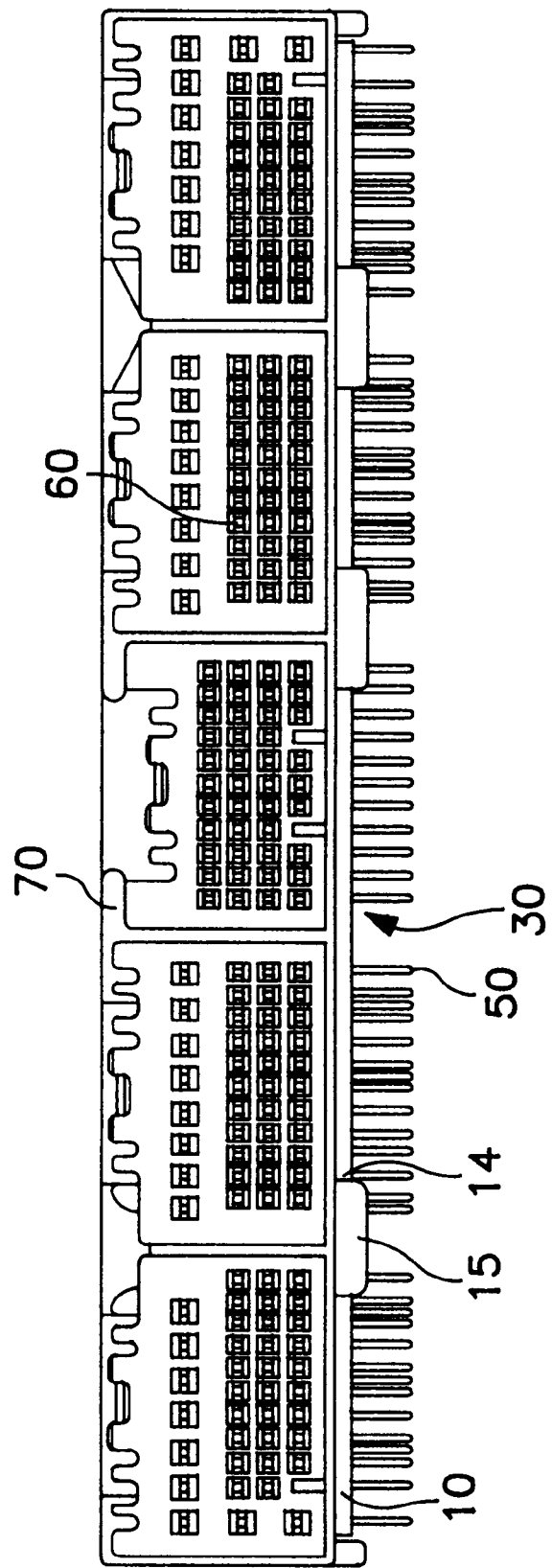
FIG. 3 is a front elevational view of the embodiment shown in FIGS. 1 and 2.

In the front elevational view of FIG. 3 showing the connector housing 70 and the alignment plate 10, the mounting portions 15 are clearly shown. The connector housing 70 may take any suitable form and configuration.

Figure 4:
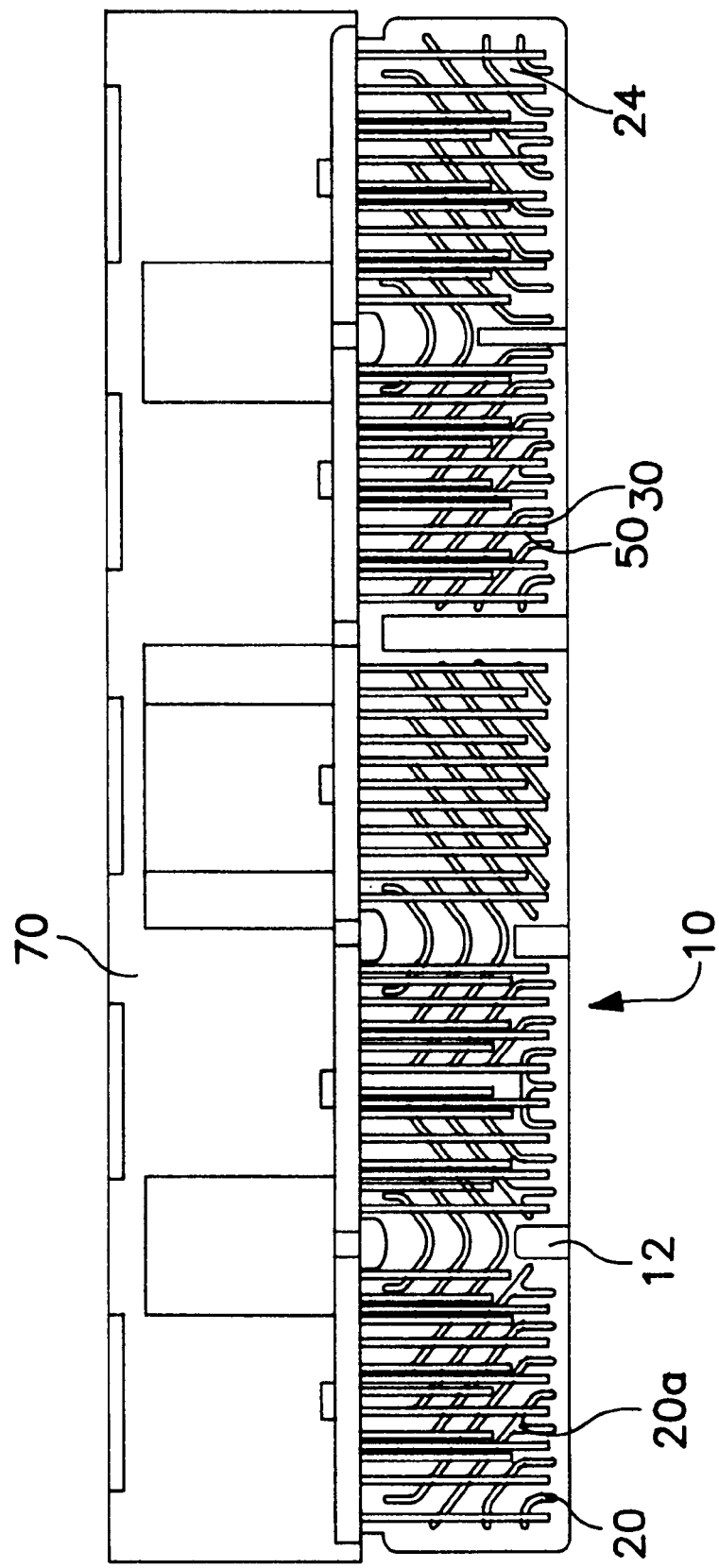
FIG. 4 is a plan view of the embodiment shown in FIGS. 1 to 3.

In the plan view of FIG. 4, one can clearly see that the punched portions 20 extend throughout the whole thickness of the alignment plate 10. However, it should be noted that similar effects can be obtained even if thinned portions are provided instead of or in addition to the punched portions 20. Further, one can recognize that the recesses 12 also form thinned portions in the alignment plate 10. These recesses 12 may extend over the entire thickness of the alignment plate 10 as in the punched portions 20.

Figure 5:
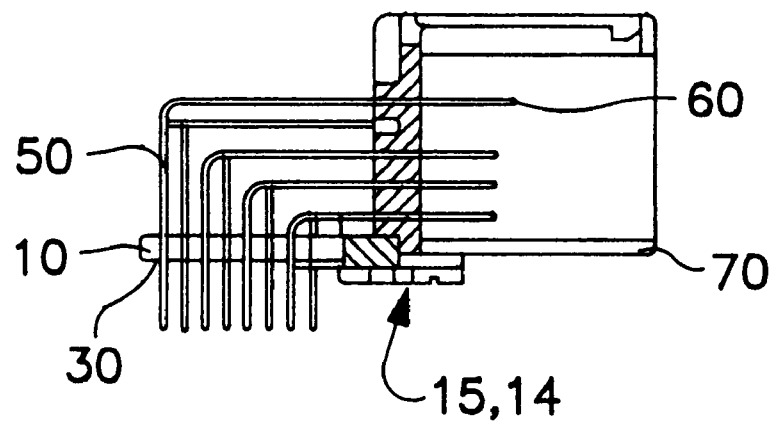
FIG. 5 is a cross-sectional view of the embodiment shown in FIGS. 1 to 4.

FIG. 5 shows the connector housing 70 including terminal ends 60 or the terminals 50 which are bent at right angles after exiting the connector housing 70 so as to pass through the alignment plate 10, namely through the openings 30. In this view, one can recognize that the alignment plate 10 is fixed to the connector housing 70 substantially without play, for instance by the snap-in engagement between the mounting portions 15 and mounting recesses 14 of the alignment plate 10.

Figure 6:
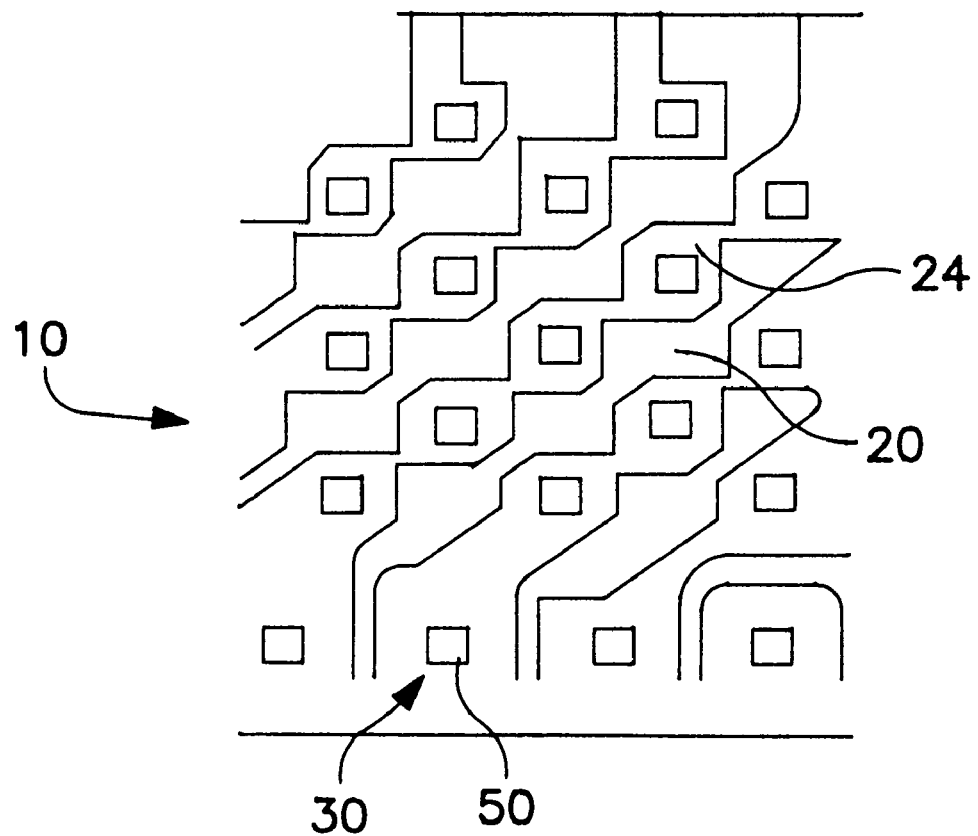
FIG. 6 is a detailed view of the platelike members, as illustrated in FIG. 2.

FIG. 6 shows another embodiment of the punched portions having a different configuration. Particularly, a detailed view of the alignment plate 10 more clearly shows the punched portions 20. As in the foregoing Figures, the punched portions 20 form narrow, movable holding portions 24 which are obliquely juxtaposed and comprise the openings 30 of different rows and columns. In order to allow a larger degree of movement in directions of the rows and/or columns, the punched portions 20 include wider portions, thus causing the narrow, movable holding portions 24 to have narrower portions. It should be noted that the configuration of the punched portions 20 is not restricted to the one shown in the Figures, but may be any configuration provided the structural stability and integrity of the movable holding portions 24 are sufficient for the intended application.

In summary, the present invention provides a platelike member for association with an electrical device such as an alignment plate, a circuit board, and the like, which is formed such that terminals received in openings, through holes or recesses of the platelike member which are arranged in a high density pattern are properly held, guided, fixed and positioned while overcoming problems resulting from mechanical and/or thermal stress and/or strain induced during the mounting operation and the use itself. The invention also provides a connector using the platelike member as an alignment plate. With such a connector, cracking of solder used to connect a circuit board with the terminals extending from the connector can be prevented.

What is claimed is:

1. A connector assembly for mounting on a circuit board, said assembly comprising a connector housing having a plurality of mounting portions for fixing the connector housing in proximity to the circuit board, a plurality of terminals, each said terminal having a first portion mounted in said connector housing and a second portion connectable with said circuit board, and an alignment plate for mounting in proximity to said circuit board, said alignment plate having a plurality of mounting recesses aligned respectively with the mounting portions of the connector housing and further comprising openings for receiving the terminals therein, the openings being arranged in columns and rows, such that the openings in each said column and each said row are at least partly offset with respect to the openings in each said column and each said row adjacent thereto, a plurality of elongate strain reducing punched portions formed through said alignment plate at locations spaced from said openings, said strain reducing punched portions being disposed such that each of said mounting recesses has a plurality of strain reducing punched portions disposed substantially concentrically thereabout, said strain reducing punched portions absorbing strain due to differential thermal expansion between said alignment plate and said connector housing.

2. A connector assembly according to claim 1, wherein the offset corresponds substantially to half of a spacing between adjacent openings in said rows and columns.

3. A connector assembly according to claim 1, wherein each said punched portion is diagonally aligned with respect to the columns and rows over at least a part of the extension of each said punched portion.

4. A connector assembly according to claim 1, further comprising at least one mounting portion and at least one notch formed to correspond to the mounting portion to reduce mechanical stress generated during mounting.

5. A connector assembly according to claim 1, wherein said punched portions are provided between each pair of adjacent openings in said rows and columns.

6. A connector assembly according to claim 1, wherein said punched portions each comprise at least one widened portion.

7. A connector assembly according to claim 1, wherein narrow movable holding portions are defined between said punched portions, each said narrow movable holding portion comprises no more than one opening from each of said columns and each of said rows.

* * * * *